United States Patent [19]
Ten Eyck

[11] Patent Number: 6,137,322
[45] Date of Patent: Oct. 24, 2000

[54] DYNAMIC OUTPUT CONTROL CIRCUIT

[75] Inventor: Timothy A. Ten Eyck, Denison, Tex.

[73] Assignee: Texas Instruments Incorporated, Dallas, Tex.

[21] Appl. No.: 09/322,530

[22] Filed: May 28, 1999

Related U.S. Application Data

[60] Provisional application No. 60/087,873, Jun. 3, 1998.

[51] Int. Cl.[7] .................................................... H03K 3/00
[52] U.S. Cl. ........................... 327/112; 327/391; 327/379
[58] Field of Search ..................................... 327/108, 110, 327/111, 112, 170, 379–381, 389, 391, 427, 434; 326/26, 27, 82, 83, 87

[56] References Cited

U.S. PATENT DOCUMENTS

| | | | |
|---|---|---|---|
| 4,829,199 | 5/1989 | Prater | 326/27 |
| 4,855,623 | 8/1989 | Flaherty | 326/87 |
| 5,237,213 | 8/1993 | Tanoi | 327/379 |
| 5,319,260 | 6/1994 | Wanlass | 326/26 |

*Primary Examiner*—Toan Tran
*Attorney, Agent, or Firm*—Alan K. Stewart; Wade James Brady, III; Frederick J. Telecky, Jr.

[57] ABSTRACT

The output control circuit includes: a first high side transistor 56 coupled to an output node 68; a second high side transistor 59 coupled in parallel with the first high side transistor 56; a first transmission gate 72 coupled between a control node of the first high side transistor 56 and a control node of the second high side transistor 59, the first transmission gate 72 is controlled by feedback from the output node 68; a first low side transistor 50 coupled to the output node 68; a second low side transistor 53 coupled in parallel with the first low side transistor 50; a second transmission gate 74 coupled between a control node of the first low side transistor 50 and a control node of the second low side transistor 53, the second transmission gate 74 is controlled by feedback from the output node 68.

8 Claims, 2 Drawing Sheets

DYNAMIC OUTPUT CONTROL CIRCUIT

This application claims priority under 35 USC § 119 (e)(1) of provisional application No. 60/087,873 filed Jun. 3, 1998.

FIELD OF THE INVENTION

This invention generally relates to electronic systems and in particular it relates to output control circuits.

BACKGROUND OF THE INVENTION

Two prior art bus driver circuits are generally offered. The first circuit is a typical bus driver circuit having fast propagation delays, but can have significant undershoots and overshoots. The second circuit is the same as the first one except that a damping resistor is added in series with the output. This series resistance alleviates the problems of overshoots and undershoots, but increases the propagation delays.

SUMMARY OF THE INVENTION

The output control circuit includes: a first high side transistor coupled to an output node; a second high side transistor coupled in parallel with the first high side transistor; a first transmission gate coupled between a control node of the first high side transistor and a control node of the second high side transistor, the first transmission gate is controlled by feedback from the output node; a first low side transistor coupled to the output node; a second low side transistor coupled in parallel with the first low side transistor; a second transmission gate coupled between a control node of the first low side transistor and a control node of the second low side transistor, the second transmission gate is controlled by feedback from the output node.

DETAILED DESCRIPTION OF PREFERRED EMBODIMENTS

Figure 1:
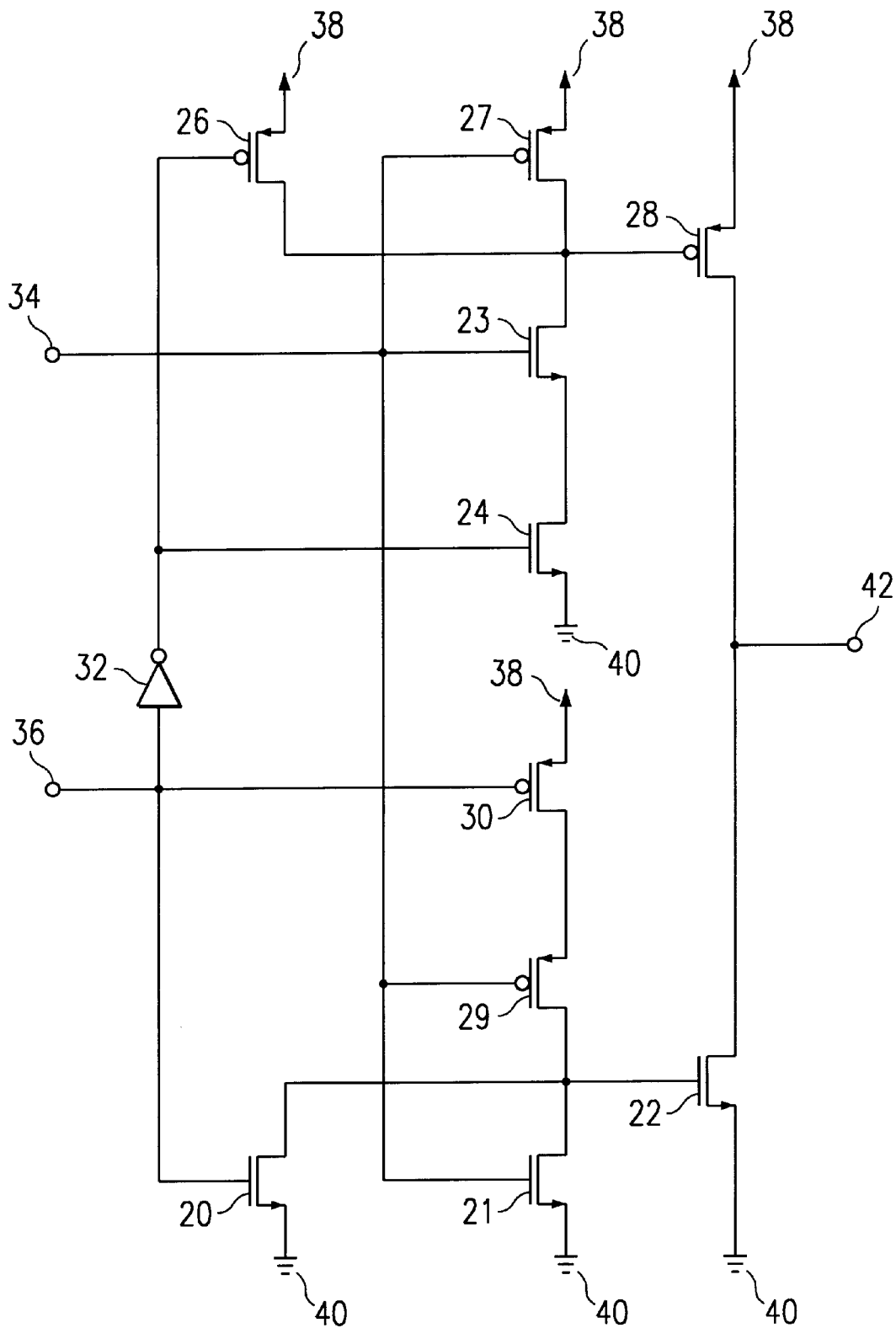
FIG. 1 is a schematic circuit diagram of a prior art output control circuit.

FIG. 1 shows a typical prior art bus driver output circuit. The circuit of FIG. 1 includes NMOS transistors 20–24, PMOS transistors 26–30, inverter 32, input node 34, tri node 36, voltage supply node 38, ground 40, and output node 42. Transistors 28 and 22 affect the output impedance at node 42. If the sizes of transistors 28 and 22 are decreased, the output impedance will increase. Increasing the output impedance will reduce overshoots and undershoots but at the cost of increased propagation delays. Decreasing the output impedance will decrease propagation delays but at the cost of increased overshoots and undershoots. A circuit which has a low output impedance for the beginning portion of the output transition and a high output impedance for the later portion of the output transition is desired. This will provide fast propagation delays with minimal or no overshoots and undershoots.

Figure 2:
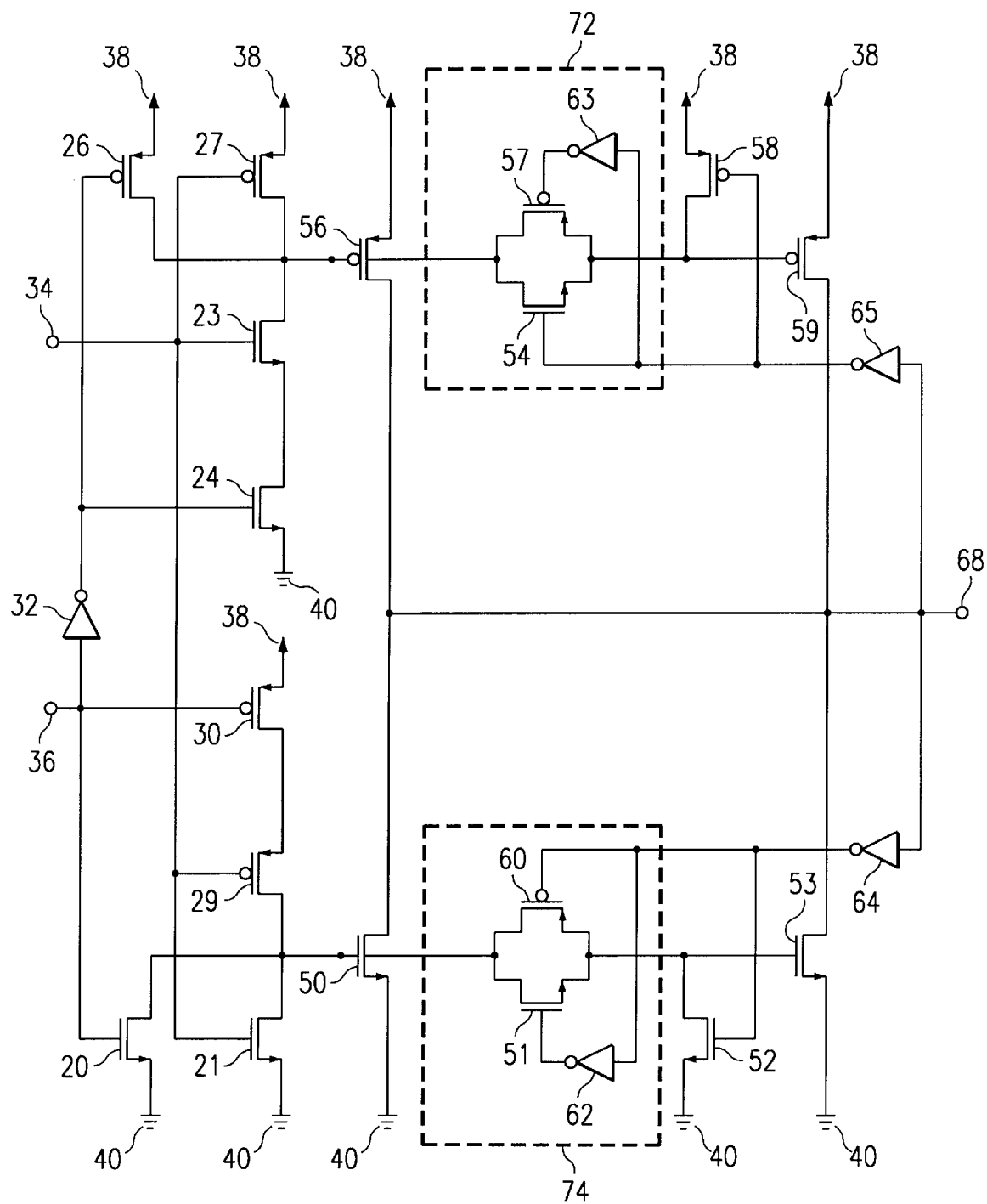
FIG. 2 is a schematic circuit diagram of a preferred embodiment dynamic output control circuit.

FIG. 2 shows a preferred embodiment dynamic output control circuit. The circuit of FIG. 2 includes NMOS transistors 20, 21, 23, 24, and 50–54, PMOS transistors 26, 27, 29, 30, and 56–60, inverters 32 and 62–65, input node 34, tri node 36, voltage supply node 38, ground 40, and output node 68. High side transistor 28 of FIG. 1 has been split into high side transistors 56 and 59 in FIG. 2. Their total width is equal to the width of transistor 28 in FIG. 1. Likewise, low side transistor 22 of FIG. 1 has been split into low side transistors 50 and 53. Transmission gates 72 and 74 (which act like a switch) have been placed between high side transistors 56 and 59, and between low side transistors 50 and 53. Transmission gate 72 is coupled between the gates (control nodes) of transistors 56 and 59. Transmission gate 74 is coupled between the gates (control nodes) of transistors 50 and 53. For the low to high output transition at node 68, transmission gate 72 is closed prior to the start of the transition. Thus the gates of transistors 56 and 59 are tied together thru the transmission gate 72, providing a low output impedance at output node 68. As the output transitions above a specified voltage (1.5 volts, for example), the output of inverter 65 goes low, opening transmission gate 72. As transmission gate 72 opens, the output impedance increases. Also, as the output of inverter 65 goes low, transistor 58 turns on, which turns off transistor 59. For the operation of the high to low transition, transmission gate 74 performs the same as transmission gate 72 performs for the low to high transition. Also, for the high to low transition, transistor 52 turns off transistor 53 in the same way that transistor 58 turns off transistor 59 in the low to high transition.

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. An output control circuit comprising:

a first high side transistor coupled to an output node;

a second high side transistor coupled in parallel with the first high side transistor;

a first transmission gate coupled between a control node of the first high side transistor and a control node of the second high side transistor, the first transmission gate is controlled by feedback from the output node;

a first low side transistor coupled to the output node;

a second low side transistor coupled in parallel with the first low side transistor;

a second transmission gate coupled between a control node of the first low side transistor and a control node of the second low side transistor, the second transmission gate is controlled by feedback from the output node; and a transistor coupled between the control node of the second high side transistor and a supply node, the transistor is controlled by feedback from the output node.

2. The device of claim 1 further comprising a transistor coupled between the control node of the second low side transistor and a ground node, the transistor is controlled by feedback from the output node.

3. The device of claim 1 wherein the first transmission gate includes an NMOS transistor coupled in parallel with a PMOS transistor.

4. The device of claim 3 further comprising a first inverter coupled between a gate of the NMOS transistor and a gate of the PMOS transistor.

5. The device of claim 4 further comprising a second inverter coupled between the output node and the gate of the NMOS transistor.

6. The device of claim 1 wherein the second transmission gate includes an NMOS transistor coupled in parallel with a PMOS transistor.

7. The device of claim 6 further comprising a first inverter coupled between a gate of the PMOS transistor and a gate of the NMOS transistor.

8. The device of claim 7 further comprising a second inverter coupled between the output node and the gate of the PMOS transistor.

* * * * *